(12) United States Patent
Weller

(10) Patent No.: US 6,820,021 B2
(45) Date of Patent: Nov. 16, 2004

(54) SYSTEM AND METHOD FOR GENERATING A SHMOO PLOT BY VARYING THE RESOLUTION THEREOF

(75) Inventor: Christopher Todd Weller, Ft. Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 35 days.

(21) Appl. No.: 10/286,679

(22) Filed: Nov. 1, 2002

(65) Prior Publication Data

US 2004/0088126 A1 May 6, 2004

(51) Int. Cl.$^7$ .............................................. G06F 12/04
(52) U.S. Cl. ........................ 702/81; 702/82; 702/179; 702/181; 702/194
(58) Field of Search .......................... 702/81, 82, 150, 702/179, 190, 194, 36, 85, 106, 121, 123, 159; 435/6, 285.2; 455/252.1; 382/100; 600/544

(56) References Cited

U.S. PATENT DOCUMENTS

| | | | |
|---|---|---|---|
| 5,484,994 A | * | 1/1996 | Roustaei ................ 235/462.25 |
| 5,828,067 A | * | 10/1998 | Rushbrooke et al. .. 250/370.11 |
| 6,023,777 A | | 2/2000 | Knaack |
| 6,079,038 A | | 6/2000 | Huston et al. |
| 6,347,163 B2 | * | 2/2002 | Roustaei ..................... 382/324 |
| 6,418,387 B1 | | 7/2002 | Carney |

* cited by examiner

Primary Examiner—Marc S. Hoff
Assistant Examiner—Felix Suarez

(57) ABSTRACT

A system and a method of testing an electrical device to determine a range of combinations of values of N parameters for which the device functions properly are described. In one embodiment, the method comprises subdividing a plot region comprising a plurality of operating points each corresponding to a particular combination of values of the N parameters into at least two partially overlapping sub-regions; testing the electrical device using the combination of values of the N variable parameters corresponding to the operating points located in each corner of each sub-region; and for each sub-region with respect to which the device does not function in the same manner at each corner operating point thereof, repeating the incrementing, subdividing and testing.

12 Claims, 8 Drawing Sheets

|  | Supply Voltage (V) | | | | | | | | | | | |
|---|---|---|---|---|---|---|---|---|---|---|---|---|
| | 1.00 | 1.10 | 1.20 | 1.30 | 1.40 | 1.50 | 1.60 | 1.70 | 1.80 | 1.90 | 2.00 | 2.10 |
| 470 | --- | --- | --- | --- | --- | --- | --- | --- | --- | --- | --- | XXX |
| 500 | --- | --- | --- | --- | --- | --- | --- | --- | --- | --- | --- | XXX |
| 530 | --- | --- | --- | --- | --- | --- | --- | --- | --- | --- | --- | XXX |
| 560 | XXX | --- | --- | --- | --- | --- | --- | --- | --- | --- | --- | XXX |
| 590 | XXX | --- | --- | --- | --- | --- | --- | --- | --- | --- | --- | XXX |
| 620 | XXX | --- | --- | --- | --- | --- | --- | --- | --- | --- | --- | XXX |
| 650 | XXX | --- | --- | --- | --- | --- | --- | --- | --- | --- | --- | XXX |
| 680 | XXX | XXX | --- | --- | --- | --- | --- | --- | --- | --- | --- | XXX |
| 710 | XXX | XXX | --- | --- | --- | --- | --- | --- | --- | --- | --- | XXX |
| 740 | XXX | XXX | --- | --- | --- | --- | --- | --- | --- | --- | --- | XXX |
| 770 | XXX | XXX | --- | --- | --- | --- | --- | --- | --- | --- | --- | XXX |
| 800 | XXX | XXX | XXX | --- | --- | --- | --- | --- | --- | --- | --- | XXX |
| 830 | XXX | XXX | XXX | --- | --- | --- | --- | --- | --- | --- | --- | XXX |
| 860 | XXX | XXX | XXX | XXX | --- | --- | --- | --- | --- | --- | XXX | XXX |
| 890 | XXX | XXX | XXX | XXX | --- | --- | --- | --- | --- | --- | XXX | XXX |
| 920 | XXX | XXX | XXX | XXX | --- | --- | --- | --- | --- | --- | XXX | XXX |
| 950 | XXX | XXX | XXX | XXX | XXX | --- | --- | --- | --- | --- | XXX | XXX |
| 980 | XXX | XXX | XXX | XXX | XXX | --- | --- | --- | --- | --- | XXX | XXX |
| 1010 | XXX | XXX | XXX | XXX | XXX | XXX | --- | --- | --- | --- | XXX | XXX |
| 1040 | XXX | XXX | XXX | XXX | XXX | XXX | XXX | --- | --- | --- | XXX | XXX |
| 1070 | XXX | XXX | XXX | XXX | XXX | XXX | XXX | XXX | --- | XXX | XXX | XXX |
| 1100 | XXX | XXX | XXX | XXX | XXX | XXX | XXX | XXX | XXX | XXX | XXX | XXX |

CPU Clock Frequency (Mhz)

KEY:
XXX = fail
--- = pass

FIG. 1
(Prior Art)

SYSTEM AND METHOD FOR GENERATING A SHMOO PLOT BY VARYING THE RESOLUTION THEREOF

This application is related to U.S. patent application No.: 10/286,785; filed Nov. 1, 2002, entitled SYSTEM AND METHOD FOR GENERATING A SHMOO PLOT BY TRACKING THE EDGE OF THE PASSING REGION and U.S. patent application Ser. No. 10/285,774; filed Nov. 1, 2002, entitled SYSTEM AND METHOD FOR GENERATING A SHMOO PLOT BY AVOIDING TESTING IN FAILING REGIONS.

BACKGROUND OF THE INVENTION

1. Technical Field of the Invention

The present invention generally relates to methods and systems for generating parametric test data for electrical devices. More particularly, and not by way of any limitation, the present invention is directed to method and system for generating a shmoo plot representative of such parametric data.

2. Description of Related Art

It is often necessary to characterize the performance of an electrical device with respect to certain operational parameters of the device. This characterization may be referred to as "parametric testing". One method by which to measure the performance of a device is on a pass/fail basis. A complete parametric test would provide a pass/fail result for every possible combination of all values of the operational parameters in question. This type of test provides users of the device information as to how the device will perform over a broad range of test conditions.

A shmoo plot is a graphical representation of the ability of an electrical device to operate properly in response to various combinations of values of two variable operating parameters, or "test conditions". For example, an integrated circuit ("IC") device might be repeatedly tested using different combinations of supply voltage and CPU clock signal frequency to determine the various test conditions in which the IC operates properly.

FIG. 1 illustrates a conventional shmoo plot 100. Each of the X- and Y-axes, designated 102(X) and 102(Y), respectively, represents the value of a test operating parameter. Continuing with the IC example set forth above, the X-axis 102(X) represents the value of supply voltage (Vcc) in units of volts ("V") and the Y-axis 102(Y) represents CPU clock signal frequency in units of megahertz ("Mhz"). To generate sufficient data to produce a useful shmoo plot, a device must be tested at an adequate number of combinations of X and Y operating parameter values within a range of interest bounded by Xmin, Xmax, Ymin, and Ymax, with some predetermined resolution in the X and Y interval size. Again, returning to the IC example, as illustrated in FIG. 1, Xmin and Xmax are 1.0 V and 2.1 V, respectively, while Ymin and Ymax are 470 Mhz and 1100 Mhz, respectively. The X and Y interval sizes are 0.1 V and 30 Mhz, respectively.

A "pass" symbol, represented in FIG. 1 by the symbol " - - - ", is plotted when the device passes a test performed under the combination of operating parameters identified by the corresponding Cartesian (X, Y) coordinate pair. Similarly, a "fail" symbol, represented in FIG. 1 by the symbol "xxx", is plotted when the device fails a test performed under the combination of operating parameters identified by the corresponding Cartesian (X, Y) coordinate pair. In the IC example used herein, the IC is deemed to have "passed" if it functions correctly under a given set of test conditions.

As evidenced by the shmoo plot 100, shmoo plots provide a clear depiction of the operational limits of a device under various test conditions. A passing region 104 comprises the collection of passing points. A failing region 106 comprises the collection of failing points. An observer can easily note where the performance of the device transitions from the passing region 104 to the failing region 106 as the operating parameters are varied. It will be recognized, however, that a significant amount of time is required to perform the tests that form each of the individual array elements of a shmoo plot. In a simple 16 ×16 shmoo plot, assuming each test requires 100 µs to perform, the entire shmoo plot would require 16×16×100 µs, or 25.6 ms, to complete. Realistically, each operating parameter will be swept over a range of 100 values and each individual test could take on the order of a second to complete. Accordingly, a shmoo plot corresponding to such a parametric test would take nearly three hours to complete.

SUMMARY OF THE INVENTION

Accordingly, the present invention advantageously provides a system and method for more rapidly generating a shmoo plot by varying the resolution thereof.

One embodiment is a method of testing an electrical device to determine a range of combinations of values of N parameters for which the device functions properly. The method comprises subdividing a plot region comprising a plurality of operating points each corresponding to a particular combination of values of the N parameters into at least two partially overlapping sub-regions; testing the electrical device using the combination of values of the N variable parameters corresponding to the operating points located in each corner of each sub-region; and for each sub-region with respect to which the device does not function in the same manner at each corner operating point thereof, repeating the incrementing, subdividing and testing.

BRIEF DESCRIPTION OF THE DRAWINGS

A more complete understanding of the present invention may be had by reference to the following Detailed Description when taken in conjunction with the accompanying drawings wherein:

A more complete understanding of the present invention may be had by reference to the following Detailed Description when taken in conjunction with the accompanying drawings wherein:

FIG. 1 illustrates a shmoo plot in accordance with the prior art;

DETAILED DESCRIPTION OF THE DRAWINGS

Figure 2:
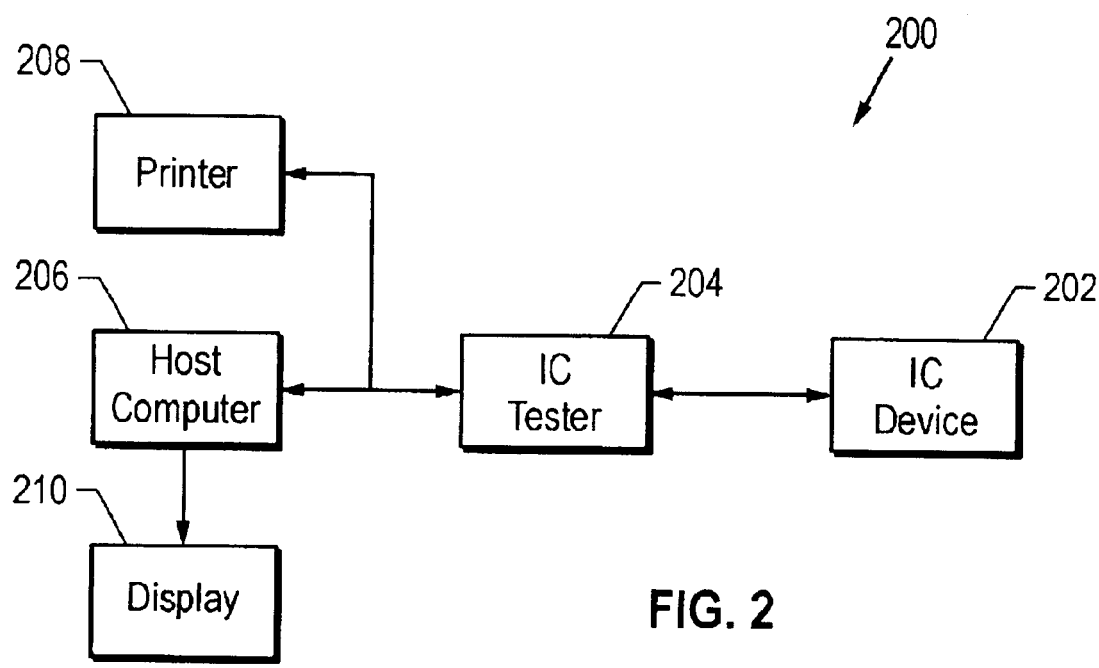
FIG. 2 is a block diagram of a system for generating a shmoo plot in accordance with one embodiment.

In the drawings, like or similar elements are designated with identical reference numerals throughout the several views thereof, and the various elements depicted are not necessarily drawn to scale.

FIG. 2 is a block diagram of a system 200 for generating a shmoo plot in accordance with one embodiment. The system 200 produces a shmoo plot indicating a range of values of a pair of operating parameters under which an IC device 202 can pass a predetermined test. The system 200 includes a conventional circuit tester 204 configurable by a host computer 206 via data and control signals sent to the tester 204. As will be recognized by one of ordinary skill in the art, the host computer 206 executes computer program instructions that dictate the operation thereof in accordance with the embodiments described herein. In accordance with one embodiment, the host computer 206 informs the tester 204 as to the value to which to set various operating parameters of the IC device 202. Once the tester 204 tests the IC device 202 under the prescribed operating parameters, it provides to the host computer 206 pass/fail data indicative of the performance of the IC device 202.

The host computer 206 utilizes the pass/fail data from the tester 204 to generate a shmoo plot, such as the one illustrated in FIG. 1, indicative of a performance envelope of the IC device 202. In one embodiment, the shmoo plot can be printed via a printer 208 and/or displayed on a display device 210 connected to the host computer 206.

As used herein, the concept of "testing a point" comprises determining whether the device passes or fails under using as operating parameters the coordinates of the point. Hence, a point "passes" if the device 202 operates properly when the operating parameters of interest input thereto are set to equal the coordinates of the point. Similarly, a point "fails" if the device 202 fails to operate properly when the operating parameters of interest input thereto are set to equal the coordinates of the point.

In accordance with one embodiment, rather than configuring the tester 204 to test the IC device 202 for every combination of X and Y operating parameters between the specified maxima and minima, the host computer 206 configures the tester 204 to test the IC device 202 only at certain operating points, as described in detail below.

Figure 3:
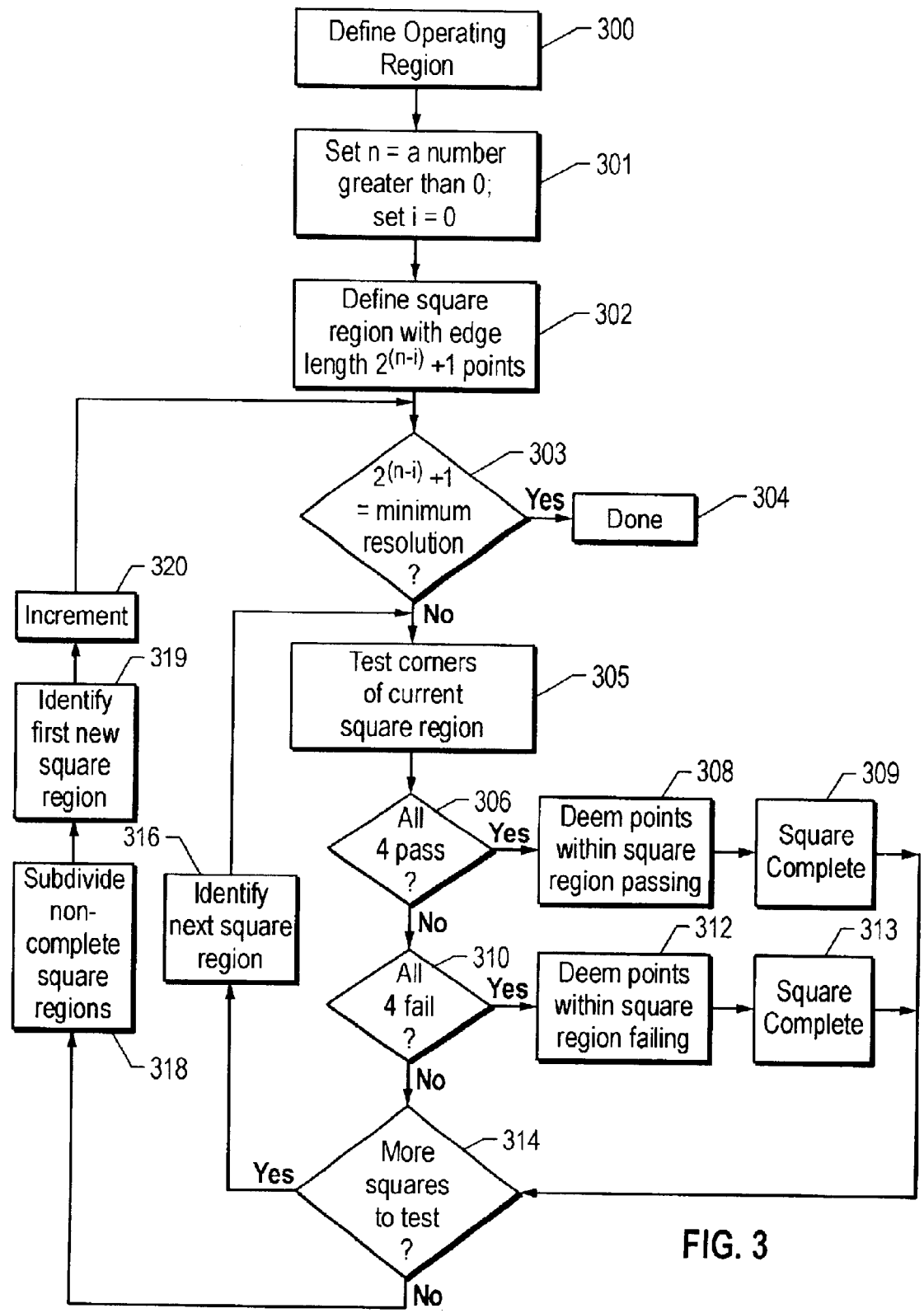
FIG. 3 is a flowchart illustrating operation of one embodiment of the present invention for generating a shmoo plot.

FIG. 3 is a flowchart of the operation of a method of generating a shmoo plot in accordance with one embodiment. In block 300, an operating region for the shmoo plot, including intervals at which the two operating parameters will be tested, is defined. For example, in the shmoo plot illustrated in FIG. 1, the operating region is defined by Xmin=1.0 V, Xmax=2.1 V, Ymin=470 Mhz, and Ymax=1100 Mhz, and X and Y operating interval sizes of 0.1 V and 30 Mhz, respectively. In block 301, a variable n is set to a non-zero number and a variable i is set to zero (0). In block 302, a square region within the operating region the length of each edge of which is $2^n+1$ points is defined. Accordingly, it will be recognized that in one embodiment, n is ideally set in block 301 to a number that results in a square region that covers substantially all of the operating region. In block 303, a determination is made whether $2^{(n-i)}+1$ is equal to the minimum resolution, which in one embodiment is deemed to be one (1). In other words, a determination is made whether n=i, indicating that all of the points in the shmoo plot have either been tested or deemed to pass or fail, as described in greater detail below. If a positive determination is made in block 303, execution terminates in block 304; otherwise, execution proceeds to block 305.

In block 305, each of the four corners of the of the currently identified square region that has not previously been tested is tested. It will be recognized that, as used herein, the concept of testing a corner of a square region is equivalent to testing a point located at the corner of the square region. In executing this block 305, it is recognized that it is not necessary to retest points that have already been tested in connection with the currently identified or another square region. In block 306, the tester determines whether all four corners of the currently identified square region have passed. If so, execution proceeds to block 308 in which all points within the currently identified square region are deemed to pass and then to block 309, in which testing of the currently identified square region is deemed complete.

If a negative determination is made in block 306, execution proceeds to block 310, in which the tester determines whether the all four corners of the currently identified square region have failed. If so, execution proceeds to block 312, in which all of the points within the currently identified square region are deemed to fail and then to block 313, in which testing of the currently identified square region is deemed complete. If a negative determination is made in block 310, execution proceeds to block 314; similarly, execution proceeds to block 314 upon completion of either block 309 or 313.

In block 314, a determination is made whether any defined square region exist that has not been tested. If so, execution proceeds to block 316 in which a next square region is identified and then returns to block 305 in which the four corners thereof are examined and/or tested. If a negative determination is made in block 314, execution proceeds to block 318, in which each defined square region that has been tested but for which testing thereof has not been deemed to have been completed (as in blocks 309 and 313) is subdivided into four smaller defined square regions the length of each of the edges of which is $2^{(n-i)}+1$ points. In block 319, a first one of the newly defined square regions is identified. In block 320, the variable i is incremented by one and execution returns to block 309.

As a practical matter, it will be noted that the operating region should be defined such that it is in fact a square region the length of each of the edges of which is $2^n+1$ points, in order to ensure that the entirety of the operating region is tested. In this case, the functions performed in blocks 300 and 302 will be combined into a single block and function. Additionally, even assuming all four corners of the operating region as so defined either pass or fail, at least one subdivision of the operating region should be made, for reasons that will be clearly demonstrated below with reference to FIGS. 4A–4E.

As will be demonstrated in FIGS. 4A–4E, each time a square is subdivided (block 318) into four smaller squares, two edges of each of the smaller squares will overlap with an edge of each of two other smaller squares and all four of the smaller squares will share one corner point in common.

Figure 4A:
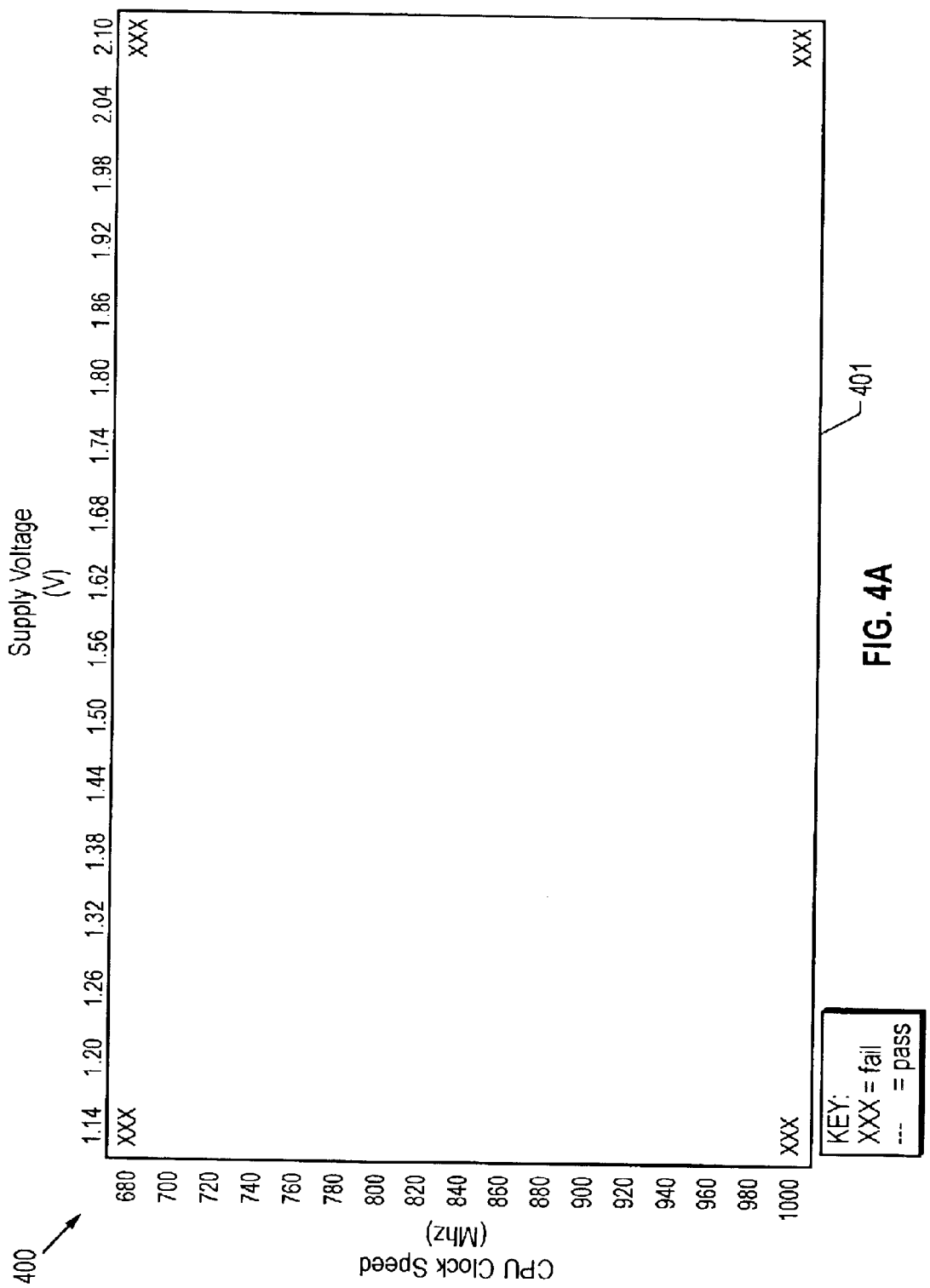
FIGS. 4A–4E illustrate generation of an exemplary shmoo plot in accordance with one embodiment as illustrated in FIG. 3.

FIG. 4A illustrates a shmoo plot 400 after blocks 300–305 have been executed for the first time. In particular, the operating region is defined by Xmin=1.14 V, Xmax=2.10 V, Ymin=680 Mhz, and Ymax=1000 Mhz, and X and Y operating interval sizes of 0.06 V and 20 Mhz, respectively. A square region 401 the length of the edges of which is $2^n+1$ points has also been defined. In the example illustrated in FIG. 4A, n is equal to four (4) and the length of each edge of the square region 401 is 17 points. The four corners of the square region 401 are identified by coordinate pairs (1.14, 680), (2.10, 680), (1.14, 1000), and (2.10, 1000). All four of the corners have been tested and have failed ("xxx"). The example depicted in FIG. 4A illustrates why the initial square region must be subdivided even if the device 202 passes or fails at all four corners; as will be illustrated in FIGS. 4B–4E, a passing region lies within the four failing corners of the square region 401.

Figure 4B:
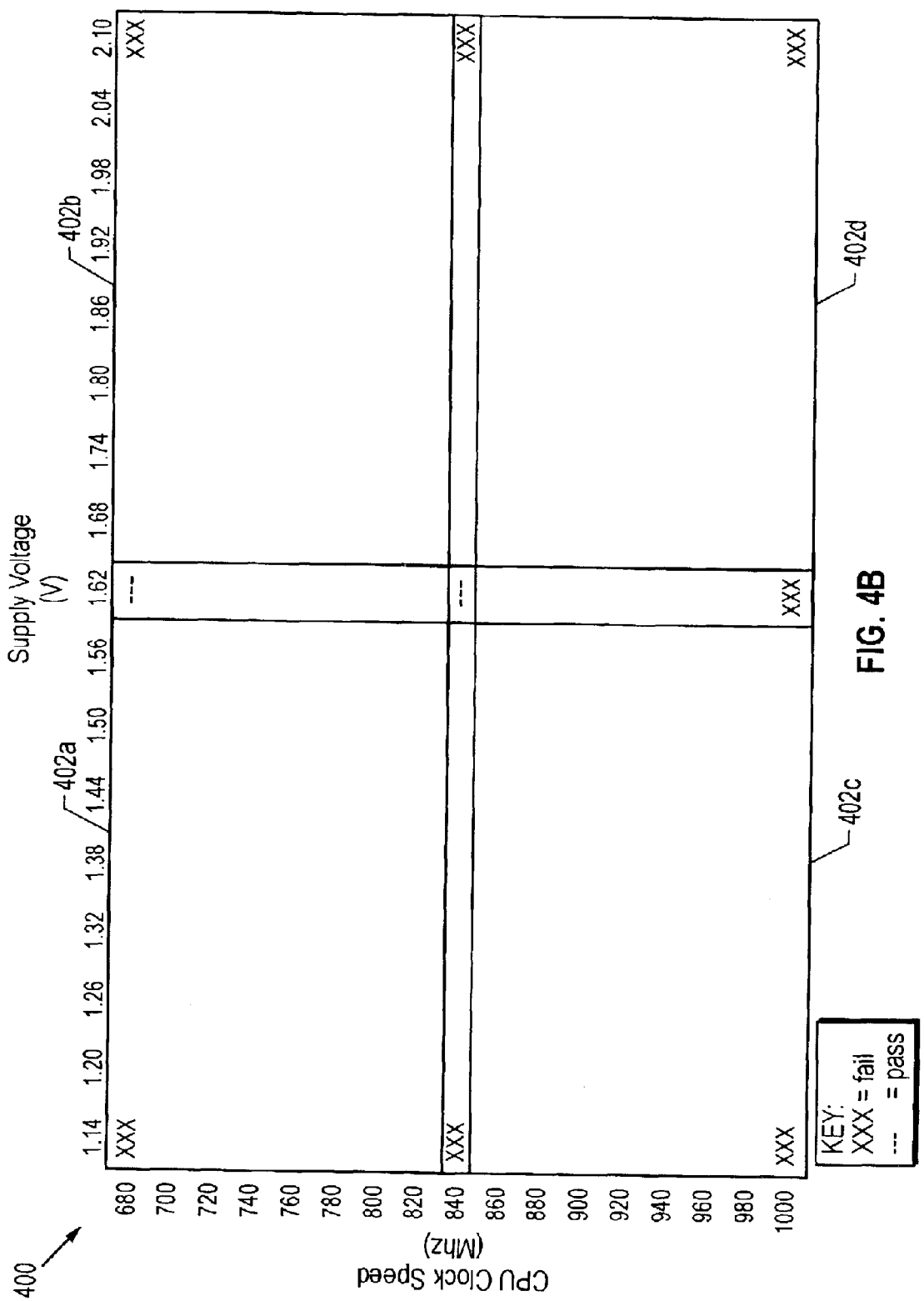

FIG. 4B illustrates the shmoo plot 400 after the original square region 401 has been subdivided into four smaller squares 402a–402d, the length of the edges of each of which is $2^{n-1}+1$, or nine (9) points. The four corners of the square 402a are defined by coordinate pairs (1.14, 680), (1.62, 680), (1.14, 840), and (1.62, 840); the four corners of the square 404b are defined by coordinate pairs (1.62, 680), (2.10, 680), (1.62, 840), and (2.10, 840); the four corners of the square 402c are defined by coordinate pairs (1.14, 840), (1.62, 840), (1.14, 1000), and (1.62, 1000); and the four corners of the square 402d are defined by coordinate pairs (1.62, 840), (2.10, 840), (1.62, 1000), and (2.10, 1000). As noted above, each square 402a–402d shares two edges with two other squares. For example, the right-most edge of the square 402a is also the left-most edge of the square 402b and the bottom edge of the square 402a is the top edge of the square 402c. Additionally, all four squares 402a–402d include the corner point defined by the coordinate pair (1.62, 840).

FIG. 4B also illustrates the results of testing of each of the four corners of each of the squares 402a–402d. As illustrated in FIG. 4B, none of the squares 402a–402d have four corners that all pass or all fail. Accordingly, each of the squares 402a–402d must be subdivided into four smaller squares the length of each edge of which is $2^{(n-2)}+1$, or five (5), points.

Figure 4C:
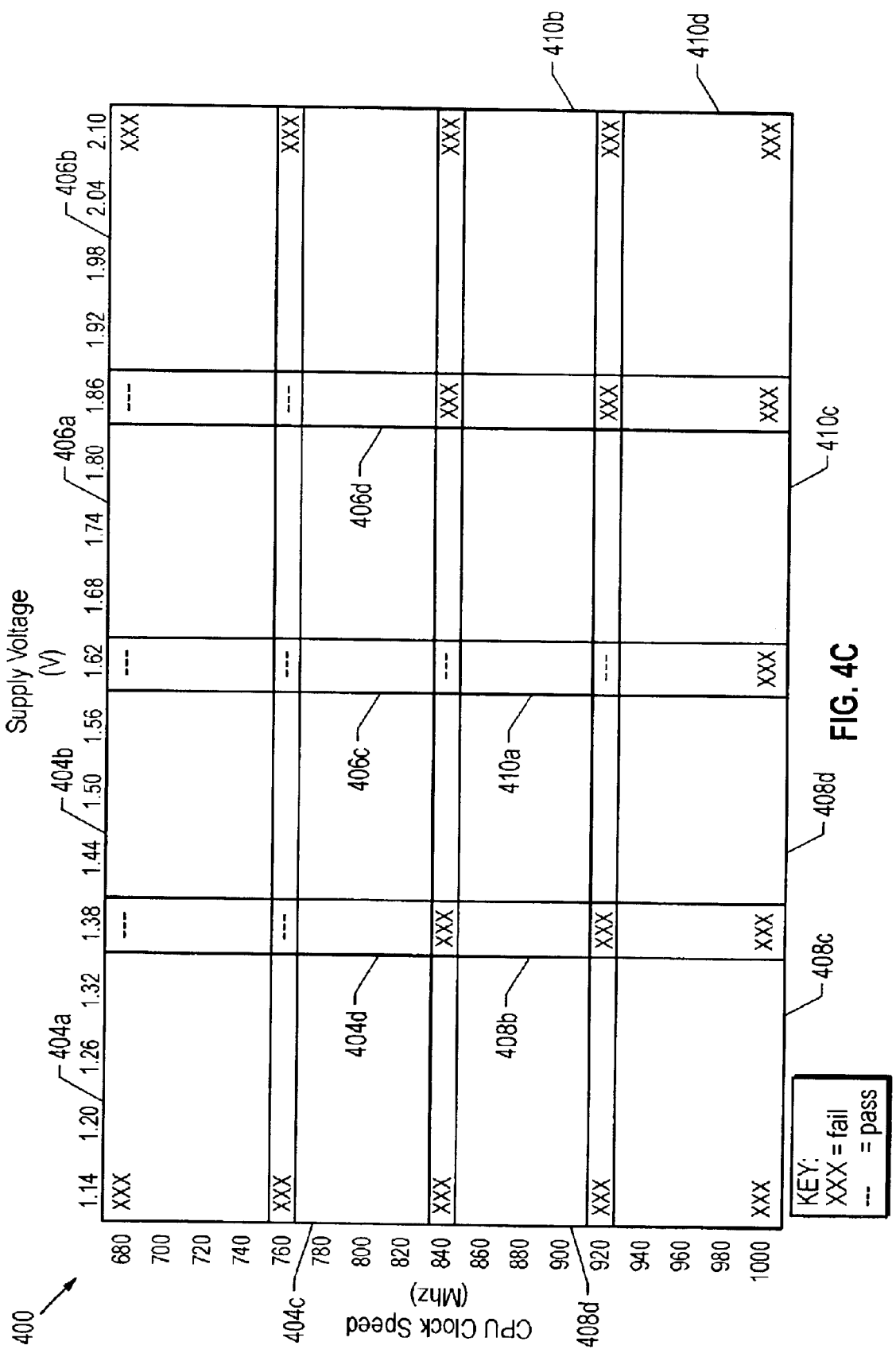

FIG. 4C illustrates the shmoo plot 400 after square 402a has been subdivided into squares 404a–404d, square 402b has been subdivided into squares 406a–406d, square 402c has been subdivided into squares 408a–408d, and square 402d has been subdivided into squares 410a–410d.

The four corners of the square 404a are defined by coordinate pairs (1.14, 680), (1.38, 680), (1.14, 760), and (1.38, 760); the four corners of the square 404b are defined by coordinate pairs (1.38, 680), (1.62, 680), (1.38, 760), and (1.62, 760); the four corners of the square 404c are defined by coordinate pairs (1.14, 760), (1.38, 760), (1.14, 840), and (1.38, 840); and the four corners of the square 404d are defined by coordinate pairs (1.38, 760), (1.62, 760), (1.38, 840), and (1.62, 840).

The four corners of the square 406a are defined by coordinate pairs (1.62, 680), (1.86, 680), (1.62, 760), and (1.86, 760); the four corners of the square 406b are defined by coordinate pairs (1.86, 680), (2.10, 680), (1.86, 760), and (2.10, 760); the four corners of the square 406c are defined by coordinate pairs (1.62, 760), (1.86, 760), (1.62, 840), and (1.86, 840); and the four corners of the square 406d are defined by coordinate pairs (1.86, 760), (2.10, 760), (1.86, 840), and (2.10, 840).

The four corners of the square 408a are defined by coordinate pairs (1.14, 840), (1.38, 840), (1.14, 920), and (1.38, 920); the four corners of the square 408b are defined by coordinate pairs (1.38, 840), (1.62, 840), (1.38, 920), and (1.62, 920); the four corners of the square 408c are defined by coordinate pairs (1.14, 920), (1.38, 920), (1.14, 1000), and (1.38, 1000); and the four corners of the square 408d are defined by coordinate pairs (1.38, 920), (1.62, 920), (1.38, 1000), and (1.62, 1000).

The four corners of the square 410a are defined by coordinate pairs (1.62, 840), (1.86, 840), (1.62, 920), and (1.86, 920); the four corners of the square 410b are defined by coordinate pairs (1.86, 840), (2.10, 840), (1.86, 920), and (2.10, 920); the four corners of the square 410c are defined by coordinate pairs (1.62, 920), (1.86, 920), (1.62, 1000), and (1.86, 1000); and the four corners of the square 410d are defined by coordinate pairs (1.86, 920), (2.10, 920), (1.86, 1000), and (2.10, 1000).

FIG. 4C also illustrates the results of testing of each of the four corners of each of the squares 404a–404d, 406a–406d, 408a–408d, and 410a–410d. As illustrated in FIG. 4C, all four corners of two of the squares (404b and 406a) are determined to have passed. Similarly, all four corners of four other squares (408a, 408c, 410b, and 410d) are determined to have failed. Accordingly, all of the squares except these four, that is, squares 404a, 404c, 404d, 406b–406d, 408b, 408d, 410a, and 410c, are each subdivided into four smaller squares the length of each edge of which is $2^{(n-3)}+1$, or three (3) points.

Figure 4D:
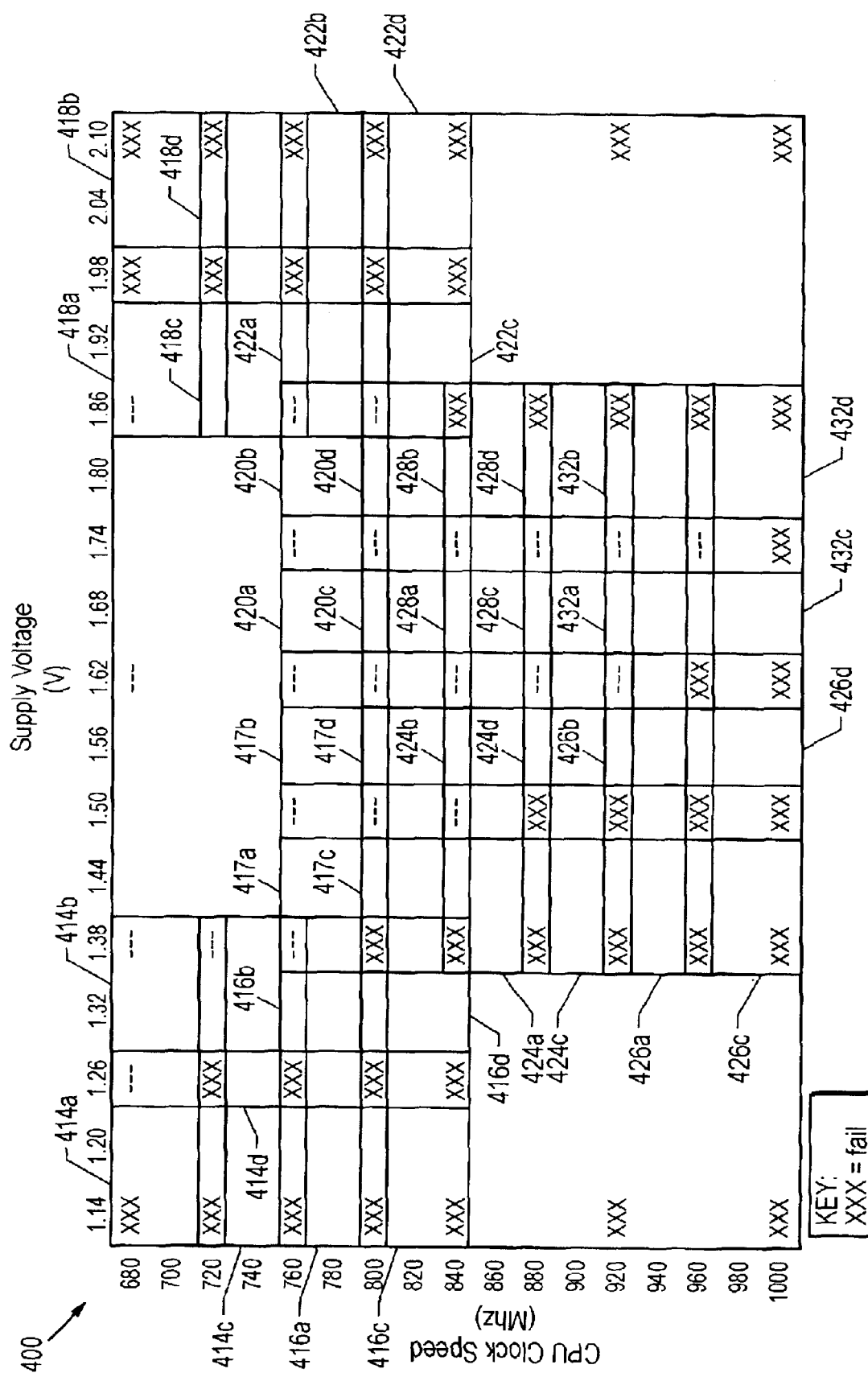

In particular, as illustrated in FIG. 4D, square 404a is subdivided into four smaller squares 414a–414d; square 404c is subdivided into four smaller squares 416a–416d; square 404d is subdivided into four smaller squares 417a–417d; square 406b is subdivided into four smaller squares 418a–418d; square 406c is subdivided into four smaller squares 420a–420d; square 406d is subdivided into four smaller squares 422a–422d; square 408a is subdivided into four smaller squares 424a–424d; square 408d is subdivided into four smaller squares 426a–426d; square 410a is subdivided into four smaller squares 428a–428d; and square 410c is subdivided into four smaller squares 432a–432d.

The four corners of the square 414a are defined by coordinate pairs (1.14, 680), (1.26, 680), (1.14, 720), and (1.26, 720); the four corners of the square 414b are defined by coordinate pairs (1.26, 680), (1.38, 680), (1.26, 720), and (1.38, 720); the four corners of the square 414c are defined by coordinate pairs (1.14, 720), (1.26, 720), (1.14, 760), and (1.26, 760); and the four corners of the square 414d are defined by coordinate pairs (1.26, 720), (1.38, 720), (1.26, 760), and (1.38, 760).

The four corners of the square 416a are defined by coordinate pairs (1.14, 760), (1.26, 760), (1.14, 800), and (1.26, 800); the four corners of the square 416b are defined by coordinate pairs (1.26, 760), (1.38, 760), (1.26, 800), and (1.38, 800); the four corners of the square 416c are defined by coordinate pairs (1.14, 800), (1.26, 800), (1.14, 840), and (1.26, 840); and the four corners of the square 416d are defined by coordinate pairs (1.26, 800), (1.38, 800), (1.26, 840), and (1.38, 840).

The four corners of the square 417a are defined by coordinate pairs (1.38, 760), (1.50, 760), (1.38, 800), and (1.50, 800); the four corners of the square 417b are defined by coordinate pairs (1.50, 760), (1.62, 760), (1.50, 800), and (1.62, 800); the four corners of the square 417c are defined by coordinate pairs (1.38, 800), (1.50, 800), (1.38, 840), and (1.50, 840); and the four corners of the square 417d are defined by coordinate pairs (1.50, 800), (1.62, 800), (1.50, 840), and (1.62, 840).

The four corners of the square 418a are defined by coordinate pairs (1.86, 680), (1.98, 680), (1.86, 720), and (1.98, 720); the four corners of the square 418b are defined by coordinate pairs (1.98, 680), (2.10, 680), (1.98, 720), and (2.10, 720); the four corners of the square 418c are defined by coordinate pairs (1.86, 720), (1.98, 720), (1.86, 760), and (1.98, 760); and the four corners of the square 418d are defined by coordinate pairs (1.98, 720), (2.10, 720), (1.98, 760), and (2.10, 760).

The four corners of the square 420a are defined by coordinate pairs (1.62, 760), (1.74, 760), (1.62, 800), and (1.74, 800); the four corners of the square 420b are defined by coordinate pairs (1.74, 760), (1.86, 760), (1.74, 800), and (1.86, 800); the four corners of the square 420c are defined by coordinate pairs (1.62, 800), (1.74, 800), (1.62, 840), and (1.74, 840); and the four corners of the square 420d are defined by coordinate pairs (1.74, 800), (1.86, 800), (1.74, 840), and (1.86, 840).

The four corners of the square 422a are defined by coordinate pairs (1.86, 760), (1.98, 760), (1.86, 800), and (1.98, 800); the four corners of the square 422b are defined by coordinate pairs (1.98, 760), (2.10, 760), (1.98, 800), and (2.10, 800); the four corners of the square 422c are defined by coordinate pairs (1.86, 800), (1.98, 800), (1.86, 840), and (1.98, 840); and the four corners of the square 422d are defined by coordinate pairs (1.98, 800), (2.10, 800), (1.98, 840), and (2.10, 840).

The four corners of the square 424a are defined by coordinate pairs (1.38, 840), (1.50, 840), (1.38, 880), and (1.50, 880); the four corners of the square 424b are defined by coordinate pairs (1.50, 840), (1.62, 840), (1.50, 880), and (1.62, 880); the four corners of the square 424c are defined by coordinate pairs (1.38, 880), (1.50, 880), (1.38, 920), and (1.50, 920); and the four corners of the square 424d are defined by coordinate pairs (1.50, 880), (1.62, 880), (1.59, 920), and (1.62, 920).

The four corners of the square 426a are defined by coordinate pairs (1.38, 920), (1.50, 920), (1.38, 960), and (1.50, 960); the four corners of the square 426b are defined by coordinate pairs (1.50, 920), (1.62, 920), (1.50, 960), and (1.62, 960); the four corners of the square 426c are defined by coordinate pairs (1.38, 960), (1.50, 960), (1.38, 1000), and (1.50, 1000); and the four corners of the square 426d are defined by coordinate pairs (1.50, 960), (1.62, 960), (1.50, 1000), and (1.62, 1000).

The four corners of the square 428a are defined by coordinate pairs (1.62, 840), (1.74, 840), (1.62, 880), and (1.74, 880); the four corners of the square 414b are defined by coordinate pairs (1.74, 880), (1.86, 880), (1.74, 920), and (1.86, 920); the four corners of the square 428c are defined by coordinate pairs (1.62, 880), (1.74, 880), (1.62, 920), and (1.74, 920); and the four corners of the square 428d are defined by coordinate pairs (1.74, 880), (1.86, 880), (1.74, 920), and (1.86, 920).

The four corners of the square 432a are defined by coordinate pairs (1.62, 920), (1.74, 920), (1.62, 960), and (1.74, 960); the four corners of the square 432b are defined by coordinate pairs (1.74, 920), (1.86, 920), (1.74, 960), and (1.86, 960); the four corners of the square 432c are defined by coordinate pairs (1.62, 960), (1.74, 960), (1.62, 1000), and (1.74, 1000); and the four corners of the square 432d are defined by coordinate pairs (1.74, 960), (1.86, 960), (1.74, 1000), and (1.86, 1000).

FIG. 4D also illustrates the results of testing of each of the four corners of each of the squares 412a–412d, 414a–414d, 416a–416d, 417a–417d, 418a–418d, 420a–420d, 422a–422d, 424a–424d, 426a–426d, 428a–428d, and 432a–432d. As illustrated in FIG. 4D, all four corners of seven of the squares, specifically, squares 417b, 417d, 420a, 420b, 420c, 428a, and 428c, are determined to pass; accordingly, these squares are deemed complete and are not further subdivided, as it is assumed that all points therewithin squares would also be determined to pass. Similarly, all four corners of 12 squares, specifically, squares 414c, 416a, 416c, 416d, 418b, 418d, 422b, 422d, 424c, 426a, 426c, and 426d, are determined to fail; accordingly, these squares will not be further subdivided, as it is assumed that all points therewithin would also be determined to fail. The remaining squares, specifically, squares 414a, 414b, 414d, 416b, 417a, 417c, 418a, 418c, 420d, 422a, 422c, 424a, 424b, 424d, 426b, 428b, 428d, and 432a–432d, are each subdivided into four squares the length of each edge of which is $2^{(n-4)}+1$ or 1, points. In one embodiment, this is the minimum resolution, as it results in every point within the larger square being tested.

Figure 4E:
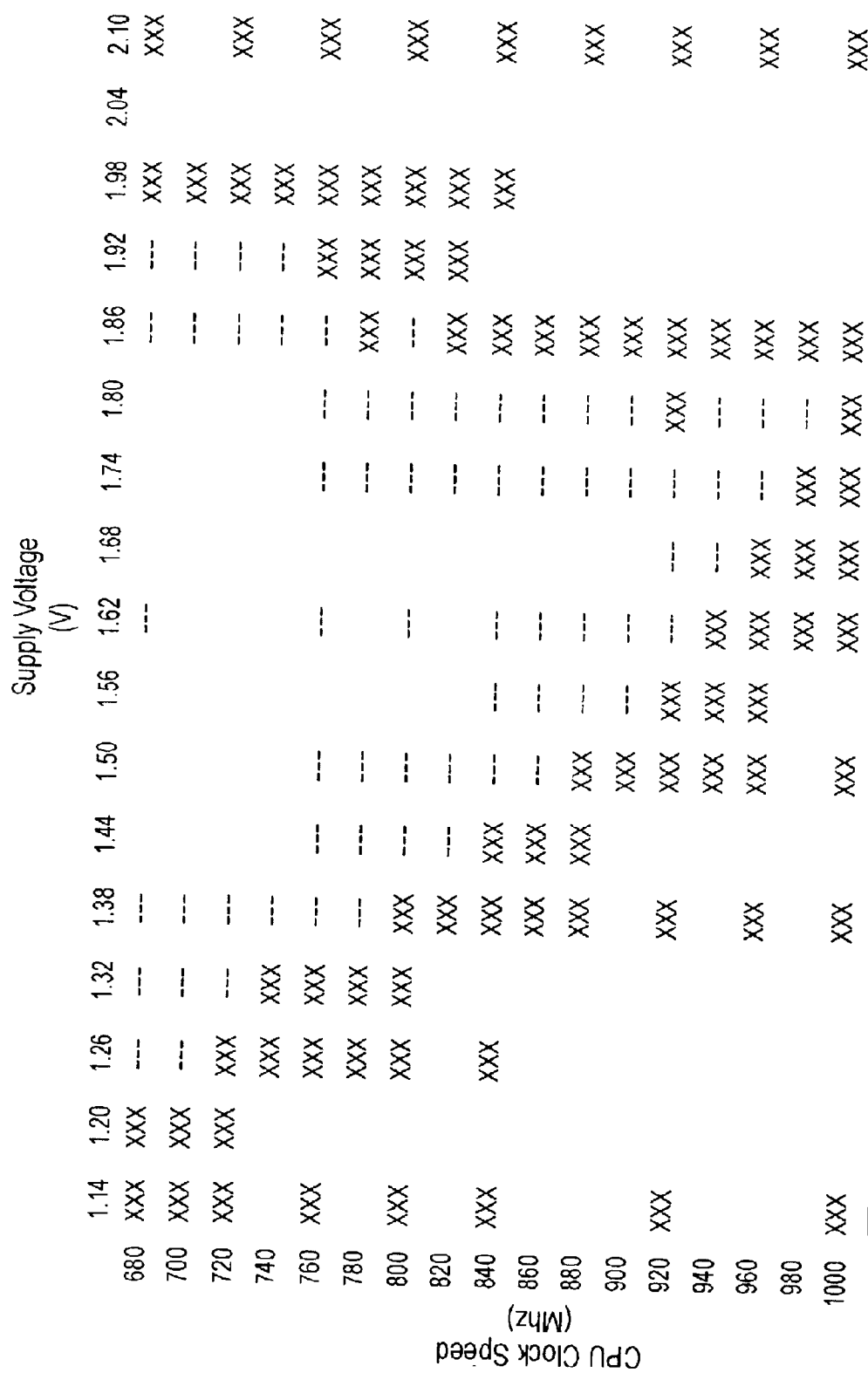

The final resultant shmoo plot 400 is illustrated in FIG. 4E. It will be recognized that only those points that have actually been tested are designated as either passing (" - - - ") or failing ("xxx"); the remaining points are left blank and may be filled in later based on the presumptions set forth above with respect to whether they lie within the passing or failing region of the plot 400.

As indicated above, as clearly demonstrated in FIGS. 4A–4E, even though all four corners of the square region 401 fail, it is advisable to subdivide the region at least one time (as illustrated in FIG. 4B) since, due to the size of the selected operating region in relation to the size and location of the passing region, it cannot be implied from the condition in which all four corners either pass or fail that all of the points therewithin also either pass or fail, respectively.

It will be recognized that the techniques set forth herein are applicable to N-dimensional shmoos, even in cases in which N is greater than 2. Generally, the shmoo will be subdivided into $2^{(n-1)}+1$ successively smaller overlapping regions of N-dimensions. As illustrated above, for N=2, the overlapping regions are four squares. For N=3, the overlapping regions would be eight cubes.

It will be further recognized that the embodiments described herein are also applicable to sub-regions having shapes other than square, including, for example, rectangular and triangular test regions.

The embodiments of the invention described herein thus provide a method and system for more rapidly generating a shmoo plot representative of parametric test data with respect to an electrical device. It is believed that the operation and construction of the embodiments will be apparent from the foregoing Detailed Description thereof.

Although the invention has been described with reference to certain illustrations, it is to be understood that the embodiments of the invention shown and described are to be treated as exemplary embodiments only. Various changes, substitutions and modifications can be realized without departing from the spirit and scope of the invention as defined by the appended claims.

What is claimed is:

1. A method of testing an electrical device to determine a range of combinations of values of N parameters for which the device functions properly, the method comprising:

defining a square plot region comprising a plurality of operating points each corresponding to a particular combination of values of the N parameters, wherein a length of each side of the plot region is $2^{n-i}+1$ operating points, wherein is initially zero;

incrementing i by one;

subdividing the square plot region into four overlapping square regions, wherein a length of each side of each square region is $2^{n-i}+1$;

testing the electrical device using the combination of values of the N variable parameters corresponding the operating points located in each corner of each square region; and for each square region with respect to which the device does not function in the same manner at each corner operating point thereof, repeating the incrementing, subdividing and testing.

2. The method of claim 1 further comprising continuing the repeating until a minimum resolution is achieved.

3. The method of claim 1 further comprising continuing the repeating until i is equal to n.

4. The method of claim 1 wherein n is initially equal to a number greater than zero.

5. The method of claim 1 further comprising if i is less than a predetermined number, for each square region with respect to which the device does function in the same manner at each corner operating point thereof, repeating the incrementing, subdividing and testing.

6. The method of claim 5 wherein the predetermined number is two.

7. A system for testing an electrical device to determine a range of combinations of values of N parameters for which device functions properly, the system comprising:

means for subdividing a plot region comprising a plurality of operating points each corresponding to a particular combination of values of the N parameters into four overlapping square regions, wherein a length of each side of each square region is $2^{n-i}+1$, wherein i is initially zero; and means for testing the electrical device using the combination of values of the N variable parameters corresponding the operating points located in each corner of each square region;

wherein for each square region with respect to which the device does not function in the same manner at each corner operating point thereof, i is incremented by one and the subdividing and testing is repeated for that square region.

8. The system of claim 7 wherein the repeating is continued until a minimum resolution is achieved.

9. The system of claim 7 further wherein the repeating is continued until i is equal to n.

10. The system of claim 7 wherein n is initially equal to a number greater than zero.

11. The system of claim 7 wherein if i is less than a predetermined number, the incrementing, subdividing and testing is repeated for each square region with respect to which the device does function in the same manner at each corner operating point thereof.

12. The system of claim 11 wherein the predetermined number is two.

* * * * *